US011538369B2

(12) United States Patent
Chen

(10) Patent No.: US 11,538,369 B2
(45) Date of Patent: Dec. 27, 2022

(54) SUPPORT PLATE, DISPLAY MODULE, AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yicai Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 111 days.

(21) Appl. No.: 17/261,442

(22) PCT Filed: Jun. 16, 2020

(86) PCT No.: PCT/CN2020/096244
§ 371 (c)(1),
(2) Date: Jan. 19, 2021

(87) PCT Pub. No.: WO2021/232521
PCT Pub. Date: Nov. 25, 2021

(65) Prior Publication Data

US 2022/0157205 A1 May 19, 2022

(30) Foreign Application Priority Data

May 22, 2020 (CN) ......................... 202010439639.5

(51) Int. Cl.
*G09F 9/30* (2006.01)
*H05K 5/00* (2006.01)

(52) U.S. Cl.
CPC ........... *G09F 9/301* (2013.01); *H05K 5/0017* (2013.01)

(58) Field of Classification Search
None
See application file for complete search history.

(56) References Cited

U.S. PATENT DOCUMENTS 9,033,760 B2 * 5/2015 Filip .................. A63F 3/00574 273/283
2013/0169515 A1 7/2013 Prushinskiy et al.
2015/0049428 A1 * 2/2015 Lee ....................... G06F 1/1652 361/679.27

(Continued)

FOREIGN PATENT DOCUMENTS

CN 104183620 A 12/2014
CN 106328599 A 1/2017

(Continued)

*Primary Examiner* — Xanthia C Cunningham
(74) *Attorney, Agent, or Firm* — PV IP PC; Wei Te Chung; Ude Lu

(57) ABSTRACT

The present disclosure provides a support plate, a display module, and an electronic device. The support plate is configured to support a flexible display panel; wherein at least one groove is defined on a side of the support plate away from the flexible display panel, a width of top of the at least one groove is greater than a width of bottom of the at least one groove, and the bottom of the at least one groove is close to the flexible display panel.

17 Claims, 3 Drawing Sheets

(56) References Cited

U.S. PATENT DOCUMENTS

| | | | | |
|---|---|---|---|---|
| 2015/0195936 | A1* | 7/2015 | Park | G06F 1/1652<br>428/161 |
| 2015/0378391 | A1* | 12/2015 | Huitema | G06F 1/163<br>361/679.03 |
| 2016/0066409 | A1* | 3/2016 | Kwon | H01L 27/1218<br>174/254 |
| 2016/0227624 | A1* | 8/2016 | Yun | H05B 33/14 |
| 2016/0343964 | A1* | 11/2016 | Kwon | H01L 51/0097 |
| 2017/0207412 | A1 | 7/2017 | Jeong et al. | |

FOREIGN PATENT DOCUMENTS

| | | | |
|---|---|---|---|
| CN | 108470523 | A | 8/2018 |
| CN | 109062439 | A | 12/2018 |
| CN | 110581155 | A | 12/2019 |
| CN | 111105718 | A | 5/2020 |

* cited by examiner

SUPPORT PLATE, DISPLAY MODULE, AND ELECTRONIC DEVICE

CROSS REFERENCE TO RELATED APPLICATIONS

This application is a National Phase of PCT Patent Application No. PCT/CN2020/096244 having International filing date of Jun. 16, 2020, which claims the benefit of priority of Chinese Application No. 202010439639.5 filed May 22, 2020. The contents of the above applications are all incorporated by reference as if fully set forth herein in their entirety.

FIELD OF INVENTION

The present disclosure relates to the field of display technology, in particular to a support plate, a display module, and an electronic device.

BACKGROUND OF INVENTION

With continuous development of flexible display technology, flexible display panels have gradually become mainstream. As shown in FIG. 1, a support plate 20 with a flat structure is usually attached under a flexible display panel 10. The support plate 20 can support and protect the flexible display panel 10.

However, when the flexible display panel 10 is bonded to the support plate 20 and then bent, resistance at a bending position is relatively large, which may generate bubbles or easily cause wrinkles on a surface of the flexible display panel 10. The wrinkles are shown by wavy lines in FIG. 2. Particularly, when a bending radius is small, the flexible display panel is likely to be damaged.

Therefore, it is necessary to provide a support plate, a display module, and an electronic device to solve the problem in the prior art.

SUMMARY OF INVENTION

The purpose of the present disclosure is to provide a support plate, a display module, and an electronic device, which can avoid the generation of bubbles or wrinkles on surfaces of the flexible display panel and prevent the flexible display panel from being damaged.

In order to solve the above technical problem, the present disclosure provides a support plate, wherein the support plate is configured to support a flexible display panel; wherein the support plate is configured to support a flexible display panel, at least one groove is defined on a side of the support plate away from the flexible display panel, a width of top of the at least one groove is greater than a width of bottom of the at least one groove, and the bottom of the at least one groove is close to the flexible display panel.

In the support plate of the present disclosure, a plurality of the grooves are defined on the side of the support plate away from the flexible display panel, each of included angles is provided between every two side walls of the grooves, and the included angles in a middle area of the support plate are less than the included angles in areas on both sides of the support plate.

In the support plate of the present disclosure, a plurality of the grooves are defined on the side of the support plate away from the flexible display panel;

Each of included angles is provided between every two side walls of the grooves, and the included angles gradually increase from a middle area of the support plate to areas on both sides of the support plate.

In the support plate of the present disclosure, the included angles range from 10° to 170°.

In the support plate of the present disclosure, shapes of the bottoms of the grooves are arc.

In the support plate of the present disclosure, the shape of the bottom of the at least one groove is semicircular, and a radius of the bottom of the at least one groove ranges from 5 um to 25 um.

In the support plate of the present disclosure, a depth of each of the at least one groove ranges from 10 um to 100 um.

In the support plate of the present disclosure, a depth of each of the at least one groove is less than a thickness of the support plate.

The present disclosure further provides a display module comprising a support plate.

The present disclosure further provides an electronic device comprising a display module.

For the support plate, the display module, and the electronic device of the present disclosure, at least one groove is defined on a side of the support plate away from the flexible display panel, the width of the top of the at least one groove is greater than the width of the bottom of the at least one groove, therefore when the flexible display panel is deformed, the at least one groove can be configured to release or weaken resistance of the deformed area, so as to prevent bubbles and wrinkles on the surface of the flexible display panel, thereby preventing damage to the flexible display panel.

DETAILED DESCRIPTION OF PREFERRED EMBODIMENTS

Figure 1:
FIG. 1 is a schematic structural diagram of a display module in the prior art.
Figure 2:
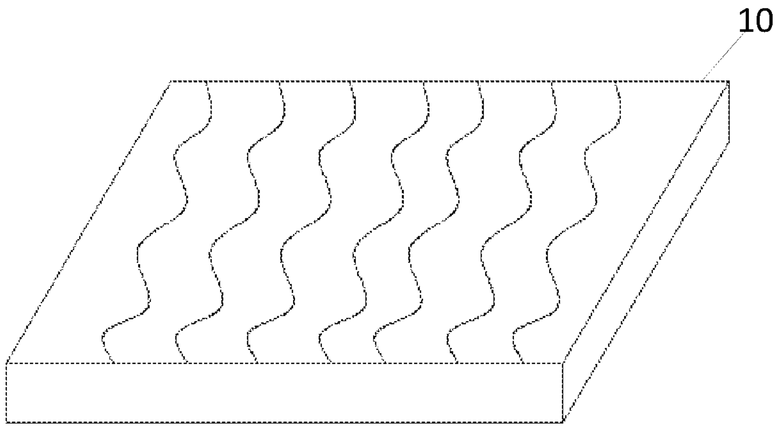
FIG. 2 is a schematic structural diagram of a flexible display panel in the prior art when wrinkles appear.

The description of the following embodiments refers to the attached drawings to illustrate specific embodiments in which the present disclosure can be implemented. The directional terms mentioned in the present disclosure, such as [up], [down], [front], [back], [left], [right], [inner], [outer], [side], etc., are only the direction of the attached drawings. Therefore, the directional terms used are used to describe and understand the present disclosure, rather than to limit the present disclosure. In the drawings, units with similar structures are indicated by the same reference numerals.

Figure 3:
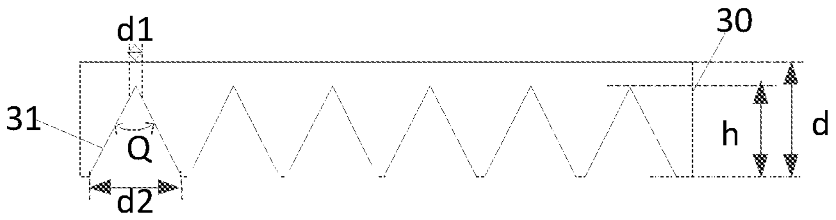
FIG. 3 is a front view of an implement of a support plate in an embodiment of the present disclosure.
Figure 4:
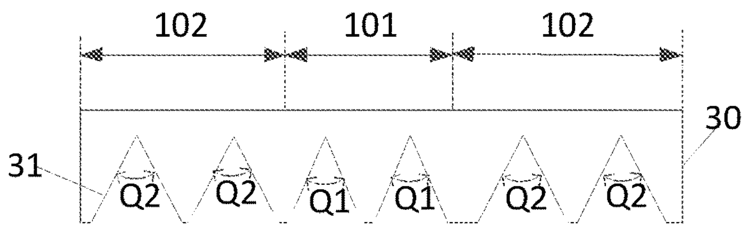
FIG. 4 is a front view of another implement of a support plate in an embodiment of the present disclosure.
Figure 5:
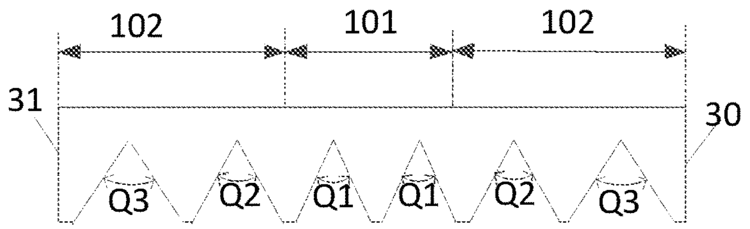
FIG. 5 is a front view of yet another implement of a support plate in an embodiment of the present disclosure.

Please refer to FIGS. 3 to 5. FIG. 3 is a front view of an implement of a support plate in an embodiment of the present disclosure.

As shown in FIG. 3, a support plate 30 of the present embodiment is configured to support a flexible display panel; wherein a plurality of grooves 31 are defined on a side of the support plate 30 away from the flexible display panel. Widths d1 of bottoms of the grooves 31 are less than widths d2 of tops of the grooves 31, and the bottoms of the grooves 31 are close to the flexible display panel.

In an implement, in order to simplify manufacturing process and reduce production costs, each of included angles Q is formed between every two side walls of the grooves 31. That is, the included angles are angles between extension lines of the left side walls and extension lines of the right side walls of the grooves 31. A plurality of included angles Q may be equal.

In an implement, as shown in FIG. 4, the included angles Q1 in a middle area 101 of the support plate 30 are less than the included angles Q2 in the areas 102 on both sides of the support plate 30. Since the deformation amount in the middle area of the support plate 30 is the largest, the included angles of the grooves in this area are set to be relatively small, thereby further reducing deformation resistance and preventing damage to the flexible display panel. Obviously, it can be understood that the included angles Q1 located in the middle area 101 of the support plate 30 may also be equal to the included angles Q2 in the areas 102 located on both sides of the support plate 30.

In another implement, as shown in FIG. 5, the included angles gradually increase from the middle area 101 of the support plate 30 to the areas 102 on both sides of the support plate 30, that is, Q3>Q2>Q1. Since the deformation amounts gradually decrease from the middle area toward the areas on both sides, the included angles of the grooves from the middle area to the areas on both sides are gradually increased, so that the deformation resistance can be better reduced, and the flexible display panel can be better prevented from being damaged. In other embodiments, for example, the included angles in the middle area 101 of the support plate 30 are the smallest (and equal), and the included angles in the areas 102 on both sides gradually increase from the inside to the outside. Obviously, it can be understood that the way of setting the included angles of the grooves is not limited to this.

In an implement, in order to better prevent damage to the flexible display panel, back to FIG. 3, the included angles Q may range from 10° to 170°. In an embodiment, in order to better prevent damage to the flexible display panel, depth of the grooves 31 may range from 10 um to 100 um. Adjacent grooves 31 can be arranged at intervals or abut each other, and the specific arrangement method is not limited.

In an implement, cross-sectional shapes of the grooves 31 are at least one of triangular, trapezoidal, or arc. The cross-sectional shape here may be a longitudinal cross-sectional shape or a front view shape.

In an implement, in order to improve support effect, the depth h of each of the grooves 31 is less than the thickness d of the support plate 30. In another embodiment, the depth h of each of the grooves 31 may also be equal to the thickness d of the support plate 30. That is, the grooves 31 penetrate the support plate at present.

Obviously, it can be understood that the number of the grooves 31 can also be one or other numbers.

Since the grooves are defined on a side of the support plate away from the flexible display panel and the widths of the tops of the grooves are greater than the widths of the bottoms of the grooves, when the flexible display panel is deformed, resistance in the deformation area can be released or weakened. When curved surface fitting is performed, stress in the bending area can be effectively reduced, so as to prevent bubbles and wrinkles on the surface of the flexible display panel, thereby effectively preventing the flexible display panel from being damaged.

Figure 6:
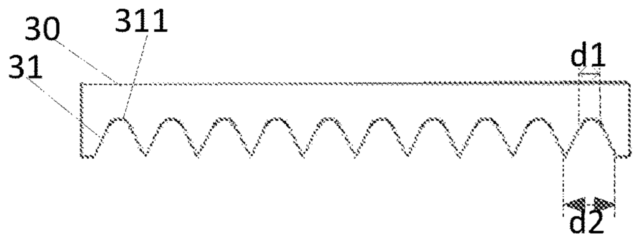
FIG. 6 is a front view of an implement of a support plate in another embodiment of the present disclosure.
Figure 7:
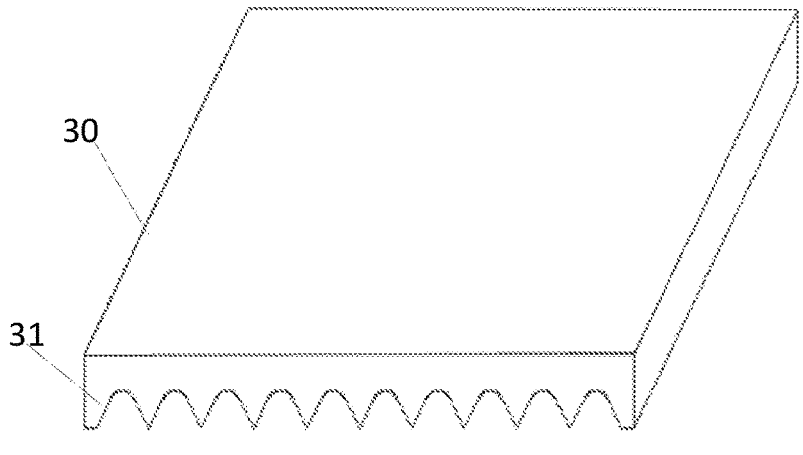
FIG. 7 is a schematic structural diagram of the support plate shown in FIG. 6.
Figure 8:
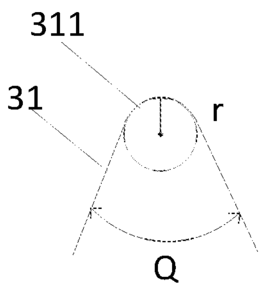
FIG. 8 is a schematic structural diagram of grooves shown in FIG. 6.

Please refer to FIGS. 6 to 8. FIG. 6 is a front view of an implement of a support plate in another embodiment of the present disclosure.

As shown in FIGS. 6 and 7, difference between the support plate of the present embodiment and the above embodiment is that shapes of the bottoms 311 of the grooves 31 of the present embodiment are arc.

In an implement, as shown in FIG. 8, the shape of the bottoms 311 of the grooves 31 is semicircular, and radius of the bottoms 311 of the grooves 31 ranges from 5 um to 25 um. The entire circular shape corresponding to the semicircular shape in FIG. 8 is shown by a dotted circle.

Since the shapes of the bottoms of the grooves are set to arc, when the flexible display panel is bent, the resistance can be further reduced, so as to better prevent the surface of the flexible display panel from wrinkling, making the surface flatter and improving yield of the products.

Figure 9:
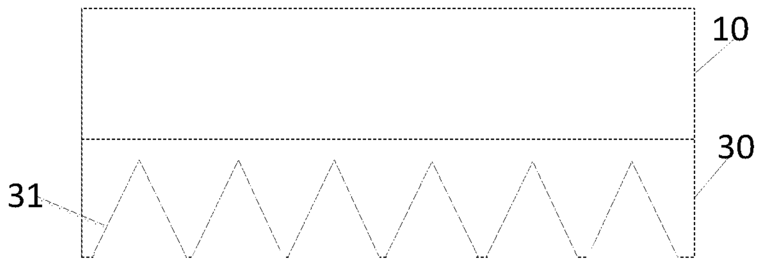
FIG. 9 is a schematic structural diagram of a display module in an embodiment of the present disclosure.

The present disclosure also provides a display module. As shown in FIG. 9, the display module includes any one of the above-mentioned support plates 30, and can further comprise a flexible display panel 10, wherein the flexible display panel 10 is located on the support plate 30. The flexible display panel is preferably an organic light emitting diode (OLED) display panel.

The present disclosure further provides an electronic device, which comprises the above-mentioned display module. The electronic device can be a mobile phone, a tablet computer, a computer, etc.

For the support plate, the display module, and the electronic device of the present disclosure, since at least one groove is defined on a side of the support plate away from the flexible display panel, the widths of the tops of the grooves are greater than the widths of the bottoms of the grooves, therefore when the flexible display panel is deformed, the grooves can be configured to release or weaken the resistance of the deformed area, so as to prevent bubbles and wrinkles on the surface of the flexible display panel, thereby preventing damage to the flexible display panel.

In summary, although preferred embodiments have been described above in the present disclosure, the above-mentioned preferred embodiments are not intended to limit the present disclosure. Those of ordinary skilled in the art can make various modifications and changes without departing from the spirit and scope of the present disclosure. Therefore, the protection scope of the present disclosure is subject to the scope defined by the claims.

What is claimed is:

1. A support plate, wherein the support plate is configured to support a flexible display panel, at least one groove is defined on a side of the support plate away from the flexible display panel, a width of top of the at least one groove is greater than a width of bottom of the at least one groove, and the bottom of the at least one groove is close to the flexible display panel;

wherein a plurality of the grooves are defined on the side of the support plate away from the flexible display panel, each of included angles is provided between every two side walls of the grooves, and the included angles in a middle area of the support plate are less than the included angles in areas on both sides of the support plate.

2. The support plate of claim 1, wherein, the included angles gradually increase from a middle area of the support plate to areas on both sides of the support plate.

3. The support plate of claim 1, wherein, the included angles range from 10° to 170°.

4. The support plate of claim 1, wherein, a shape of the bottom of the at least one groove is arc.

5. The support plate of claim 4, wherein, the shape of the bottom of the at least one groove is semicircular, and a radius of the bottom of the at least one groove ranges from 5 um to 25 um.

6. The support plate of claim 1, wherein, a depth of each of the at least one groove ranges from 10 um to 100 um.

7. The support plate of claim 1, wherein, a depth of each of the at least one groove is less than a thickness of the support plate.

8. A display module, comprising a support plate, wherein the support plate is configured to support a flexible display panel, at least one groove is defined on a side of the support plate away from the flexible display panel, a width of top of the at least one groove is greater than a width of bottom of the at least one groove, and the bottom of the at least one groove is close to the flexible display panel;

wherein a plurality of the grooves are defined on the side of the support plate away from the flexible display panel, each of included angles is provided between every two side walls of the grooves, and the included angles in a middle area of the support plate are less than the included angles in areas on both sides of the support plate.

9. The display module of claim 8, wherein, the included angles gradually increase from a middle area of the support plate to areas on both sides of the support plate.

10. The display module of claim 8, wherein, the included angles range from 10° to 170°.

11. The display module of claim 8, wherein, a shape of the bottom of the at least one groove is arc.

12. The display module of claim 11, wherein, the shape of the bottom of the at least one groove is semicircular, and a radius of the bottom of the at least one groove ranges from 5 um to 25 um.

13. The display module of claim 8, wherein, a depth of each of the at least one groove ranges from 10 um to 100 um.

14. The display module of claim 8, wherein, a depth of each of the at least one groove is less than a thickness of the support plate.

15. An electronic device, comprising a display module, which comprises a support plate configured to support a flexible display panel, wherein at least one groove is defined on a side of the support plate away from the flexible display panel, a width of top of the at least one groove is greater than a width of bottom of the at least one groove, and the bottom of the at least one groove is close to the flexible display panel;

wherein a plurality of the grooves are defined on the side of the support plate away from the flexible display panel, each of included angles is provided between every two side walls of the grooves, and the included angles in a middle area of the support plate are less than the included angles in areas on both sides of the support plate.

16. The electronic device of claim 15, wherein, the included angles gradually increase from a middle area of the support plate to areas on both sides of the support plate.

17. The electronic device of claim 15, wherein a shape of the bottom of the at least one groove is arc.

* * * * *